US010169128B1

(12) United States Patent
Asnaashari et al.

(10) Patent No.: US 10,169,128 B1
(45) Date of Patent: Jan. 1, 2019

(54) REDUCED WRITE STATUS ERROR POLLING FOR NON-VOLATILE RESISTIVE MEMORY DEVICE

(71) Applicant: Crossbar, Inc., Santa Clara, CA (US)

(72) Inventors: Mehdi Asnaashari, Danville, CA (US); Robin Sarno, Pleasanton, CA (US); Ruchirkumar D. Shah, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 15/613,922

(22) Filed: Jun. 5, 2017

Related U.S. Application Data

(60) Provisional application No. 62/346,153, filed on Jun. 6, 2016.

(51) Int. Cl.
*G06F 11/00* (2006.01)
*G06F 11/07* (2006.01)
*G06F 3/06* (2006.01)

(52) U.S. Cl.
CPC ........ *G06F 11/0751* (2013.01); *G06F 3/0688* (2013.01); *G06F 11/0772* (2013.01); *G06F 11/0787* (2013.01)

(58) Field of Classification Search
CPC ............. G06F 11/0751; G06F 11/0787; G06F 11/0772; G06F 11/07566; G06F 3/0688
USPC ...... 714/704, 718, 723, 763, 6.1, 6.11, 6.13; 324/555
See application file for complete search history.

(56) References Cited

U.S. PATENT DOCUMENTS

| | | | |
|---|---|---|---|
| 8,812,933 B2* | 8/2014 | Joo ........................ | G11C 16/10 365/185.09 |
| 2015/0127972 A1* | 5/2015 | Chun .................. | G06F 11/1008 714/6.13 |
| 2017/0206131 A1* | 7/2017 | Christensen ........ | G06F 11/1072 |

* cited by examiner

*Primary Examiner* — Christine Tu
(74) *Attorney, Agent, or Firm* — Amin, Turocy & Wastson, LLP

(57) ABSTRACT

Resistive switching memory architectures disclosed herein are capable of achieving fast read/write times and, particularly in the case of multi-bank parallel processing, executing many read or write operations per second. Because resistive switching memory is not guaranteed to be error free, resistive memory controllers can be programmed for error management when paired with such memory architectures. To reduce error management overhead, a dedicated error pin is provided to mitigate or avoid the need for a status read in conjunction with each read or write operation issued to a memory device. A status read can be implemented in response to an error signal on the dedicated error pin, but otherwise can be avoided.

20 Claims, 9 Drawing Sheets

REDUCED WRITE STATUS ERROR POLLING FOR NON-VOLATILE RESISTIVE MEMORY DEVICE

CROSS-REFERENCE TO RELATED APPLICATIONS

The present application for patent claims the benefit of U.S. Provisional Patent Application No. 62/346,153 filed Jun. 6, 2016 and titled "PERSISTENT MEMORY ARCHITECTURE AND METHOD TO REDUCE WRITE STATUS POLLING TO ERRORS", which is hereby incorporated by reference herein in its entirety and for all purposes.

TECHNICAL FIELD

This disclosure relates generally to techniques for reducing status polling on RRAM memory devices.

BACKGROUND

The present invention is generally related to techniques to overcome limitations associated with status polling on an RRAM device (e.g., standalone memory). Polling is the process of periodically reading the status of an operational activity until a device indicates the operation is complete. For instance, a non-volatile flash memory requires status polling to determine whether a read or write command has completed, regardless of whether an error occurs or does not occur. As next generation non volatile memory technologies become faster and faster as compared to flash memories, current polling mechanisms are becoming antiquated and tend to consume a substantial amount of bus bandwidth which results in a lowering of system performance. As such, new methods for determining whether errors occur upon completion of a device operation are needed.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Described herein are systems, methods, articles of manufacture, and other embodiments, implementations or techniques to overcome limitations associated with status polling on an RRAM device. In an embodiment, a method is provided comprising issuing a memory command to a bank of non-volatile resistive switching memory. In an aspect, the method can further include receiving a signal on a dedicated error pin indicative of a memory operation error for a non-volatile resistive switching memory. In another aspect, the method can include determining whether the signal indicates the memory operation error or memory operation success. In yet another aspect, the method can include referencing a status register associated with the bank of non-volatile resistive switching memory and identifying error information pertaining to the memory operation error in response to determining the signal indicates the memory operation error.

Also described herein is a system embodiment comprising an issuance component that issues a memory command to a bank of non-volatile resistive switching memory. In an aspect, the system can employ a transmission component that receives a signal on a dedicated error pin indicative of a memory operation error for a non-volatile resistive switching memory. In another aspect, the system can employ a determination component that determines whether the signal indicates the memory operation error or memory operation success. In yet another aspect, the system can employ a referencing component that references a status register associated with the bank of non-volatile resistive switching memory and identifying error information pertaining to the memory operation error in response to determining the signal indicates the memory operation error.

This disclosure comprises embodiments of systems and methods to reduce write status polling to identify write errors in writing to two-terminal resistive memory. The method comprises employing a two-terminal, non-volatile memory technology controller to act in response to a detected occurrence of an error rather than continuous polling for a posted error status during the time a command is executing.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
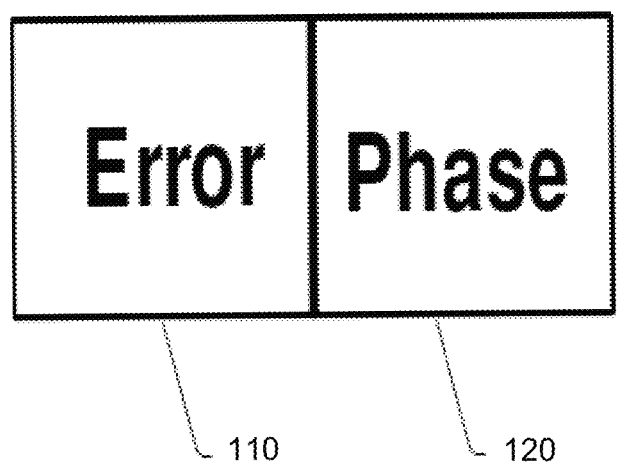
FIG. 1 illustrates a non-limiting example of two terminal resistive memory status bits.

Referring generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Resistive switching memory described in the subject disclosure can include filamentary-based devices, in various embodiments, including, e.g., a non-volatile memory device, a volatile selector device, a combination of the foregoing, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, doped p-type (or n-type) silicon (Si) bearing layer (e.g., a p-type or n-type Si bearing layer, p-type or n-type polysilicon, p-type or n-type polycrystalline SiGe, etc.), a resistive switching layer (RSL) and an active metal layer capable of being ionized. Under suitable conditions, the active metal layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include SixGeyOz (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOx, TiOx, AlOx, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent application Ser. No. 11/875,541 filed Oct. 19, 2007 and application Ser. No. 12/575,921 filed Oct. 8, 2009, and the following U.S. patent application assigned to the assignee of the present application for patent application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

In an aspect of this disclosure, a method is disclosed for reducing the amount of polling to non-volatile resistive-switching memory devices such that the non-volatile resistive-switching memory controller acts to correct or mitigate a write error in response to detection of an error and accessing a status register associated with a bank of non-volatile memory to acquire information about the error. Polling can be implemented following expiration of an estimate write time associated with physical write characteristics for the bank of non-volatile memory. During a write operation, an error write failure for resistive switching memory must be accounted for and communicated to a controller, such as a host memory controller or a controller located on a memory module (e.g., a dual-inline memory module (DIMM) or other suitable standard or non-standard memory module). For a non-standard memory module comprising non-volatile, resistive switching memory coupled to a DDR3 interface for example, a pin of the DDR3 interface that's not being used for other purposes can be purposed (or repurposed) as an error pin. This error pin can be utilized to notify the controller of a write error in response to occurrence of a write error at a bank of the non-volatile, resistive switching memory. For a non-standard memory module employing a DDR4 interface, an alert pin may be re-purposed as an error pin to indicate to the memory controller the occurrence of a write error. Thus, when an resistive switching device encounters problems with a write command after exhausting a write algorithm, an error pin can be asserted at a low signal to indicate a write error. At that instance, a host memory controller or onboard module controller (as applicable) may take proper measures in response to the write error. In an embodiment, the controller can access a status register associated with a bank of memory experiencing the write error to acquire information pertaining to the error, and to implement remediation procedures (e.g., reissue the write command, issue the write command to a different memory address, issue the write command to a different bank of memory, etc.). The error generation and recovery of an error mechanism can be similar to those prescribed in ONFI and DDR standard interfaces, but these are only examples of the disclosed embodiments and are interface independent mechanisms in at least some embodiments.

The disclosed memory architectures and processes save time in detecting an error status and implementing remediation measures. This can be achieved by polling an error pin only after an expected successful write time (e.g., associated with physical write characteristics of a bank of resistive switching memory), or by responding to a change in the error pin signal (e.g., an interrupt of the controller caused by assertion of the error pin). As such, the amount of polling to one or more banks of resistive switching memory devices is dramatically reduced. Because resistive switching memory can have write times on the order of a microsecond or a few microseconds, depending on implementation, reducing write polling can significantly reduce controller overhead in conjunction with write operations for such devices.

Various disclosed embodiments reduce or eliminate write status polling to find out if a write command has completed regardless of whether or not an error occurred. In an aspect, the method comprises re-purposing, re-defining, or creating an error pin on a resistive memory device bus that indicates to the resistive memory controller that an error has occurred. The re-purposing can include utilizing an existing pin on a standard memory bus, such as an ONFI bus or DDR bus, such as a RDY/BSY pin of ONFI or an alert_n pin of DDR4, and re-defining the behavior of such pin to accommodate error signaling.

For instance, an existing ONFI RDY/BSY pin is normally unconnected in a high performance Flash Controller (FC), however, such pin is required on the ONFI bus protocol. Since the RDY/BSY pin is already present, such pin can be re-purposed to serve as a resistive memory write error pin. Similarly, a DDR bus alert_n pin can also be re-purposed to serve as the resistive memory error pin. In an aspect, the memory device controller can send a write command to the memory device (non-volatile, resistive switching memory) and initialize a timer. The timer can be programmed to expire after an expected write time of the resistive memory after which an inference can be drawn that completion of the command (e.g., write command) has occurred.

In a non-limiting example embodiment, when the timer expires, the controller will sample the error pin. A successful completion of the command results in no indication of error on the error pin at the expiration of the timer. If the command is not successfully completed, an error is indicated at the error pin at least at completion of the time period (or earlier). If the error pin indicates an error, the controller begins to take proper actions to recover from the error. Such actions can include reading a status register of a memory device to which the command was issued, to retrieve more information associated with the error.

In another non-limiting embodiment, the memory device controller can be connected to (e.g., monitor) the error pin after issuing the command. In response to an error indication on the error pin, the resistive memory controller receives an interrupt. In response to the interrupt, the resistive memory controller can acquire information pertaining to the error (e.g., access a status register), initiate error remediation (e.g., reissue the command, modify the command, etc.), and so forth. Such activities can correspond to an error status in a single bank device, and similar mechanisms can be extended to a multi-bank device.

The error pin can also be employed in a multi-bank resistive memory device. In a multi-bank device, each memory bank comprises an array of resistive memory cells, and can have independent command and data channels as well as control circuitry, and can implement memory operations independently of other banks. Accordingly, command errors can also occur at one or more memory banks independent of other memory banks. When issuing a command, a resistive memory controller can select a target memory bank for the command. From an error detection perspective, each bank can emit an error signal indicating an error status of a particular bank. In order to conserve the use of hardware pins for error reporting, groups of error signals can be aggregated (e.g., with a logical OR circuit) on a single error pin. For instance, if there are multiple errors, the aggregated error pin will indicate an error. To identify a source (memory bank) of the error, the resistive memory controller can access one or more status registers associated with the memory banks and then implement corrective processes.

In another aspect, upon issuing a memory command for a given memory bank, the resistive memory controller can initialize a timer. Additional timers can be set for other memory commands assigned to different banks of memory. As such, multiple timers can be outstanding at any given time. Accordingly, the controller can sample the error pin at the expiration of any single timer to determine if an error occurred associated with a command related to the expired timer. When asserted, the error can correspond to any of the commands being processed by the device. In an embodiment, the error may correspond to a bank with an expired completion timer or to any other bank in the process of executing a command. In another embodiment, an error may be asserted by a bank only at expiration of its completion timer such that the occurrence of an error will coincide with an expiration of a timer. In the latter embodiment, occurrence of the error can identify the bank (or group of banks, if multiple timers expire at the occurrence of the error) associated with the completed timer.

When the error pin(s) is asserted, the controller can read the status register(s) of all banks (or an aggregate status register for all banks) in an embodiment. In another embodiment, the controller can read a status register(s) only for those banks that are or were in the process of executing a command. In yet another embodiment, the controller can read a status register(s) only for those banks having expiration timers concurrent with activation of the error pin. In response to accessing the status register(s), a controller can identify the bank in error and take proper action to correct the error. In another non-limiting embodiment, the controller can read the status register and reset the error pin after such read. Furthermore, the controller can be configured to delay resetting of the error pin until verifying (e.g., via the status registers) that no additional error(s) has occurred.

Where multiple memory bank status signals are aggregated at a single error pin, the error pin may be wired together in a logical OR fashion in order to allow the error pin to become active in response to an error at any of the multiple memory banks aggregated to the error pin. In an embodiment, error signals of all memory arrays on a single channel are connected together to a common error pin. In another embodiment, error signals of all memory banks/devices in a memory system are connected together on a single error pin. In an instance, an error pin is asserted to indicate an error, then the error could be corresponding to all the banks in all devices that are in the process of executing a command. At the time of expiration of any of the timers such that completion of one of the commands is indicated, the controller can sample the error pin. At the time of assertion, the error can correspond to any of the commands processed by the device.

The controller is then capable of reading an aggregated status register associated with one or more devices. The controller identifies the memory bank reporting the error and takes proper action to correct the error. Furthermore, the controller can be configured to employ precaution when servicing an error in the event that another bank in the process of completing commands asserts an error(s). In an aspect, a write error command can be represented by the error pin. In further embodiments, the resistive memory error pin can also be utilized to identify errors with other commands (e.g., read, erase, etc.).

In an aspect, a resistive memory controller can have the option to use the error pin as an interrupt or a polled register signal in accordance with the resistive memory controller's firmware design and configuration. In another aspect, the resistive memory is configured to read error data from a status register(s) in response to an interrupt by the error pin in order to identify a source (e.g., memory bank(s)) of the error, correct the error(s), and direct the clearing of the resistive memory error pin. For instance, the resistive memory controller will wait to reset the error pin until all errors identified in the status register(s) are corrected, and no additional errors have been posted to the status register(s) while correcting previous errors. In other words, the error pin may not be cleared until the resistive memory controller performs a status read at the status register(s) and no new error is posted to the status register(s).

Turning now to FIG. 1, illustrated is a representation of bank status 100 for a bank of memory which includes at least two bits of data: an error status bit 110 and a phase status bit 120. In an aspect, error status bit 110 represents an indication of whether an error has occurred. Thus if error status bit 110 is a zero, then the controller understands that no error has occurred. If the error status bit 110 is a one, then the controller understands that an error has occurred. It should be understood that this relationship of the error status bit 110 and error status is mere convention, and other relationships (e.g., zero=error and one=no error) can be employed within the scope of the present disclosure. The phase status bit 120 indicates a write phase in which an error occurred. As one example, if phase status bit 120 is a zero, then the write error occurred for a set phase of a write operation (e.g., setting a zero to a one, or other suitable convention). To continue this example, if phase status bit 120 is a one, then the write error occurred for a reset phase of the write operation (e.g., resetting a one to a zero). Accordingly, if a controller detects an error at a particular phase then the error can be corrected at the identified phase for which the error occurred. Thus the error correction can repeat a reset operation to reset bits that need to be reset (e.g., to a zero) to complete the write command, or can repeat a set operation to set bits that need to be set (e.g., to a one) to complete the write command. With different language, the error correction can be resumed at the particular phase of a write operation at which the error had occurred.

Figure 2:
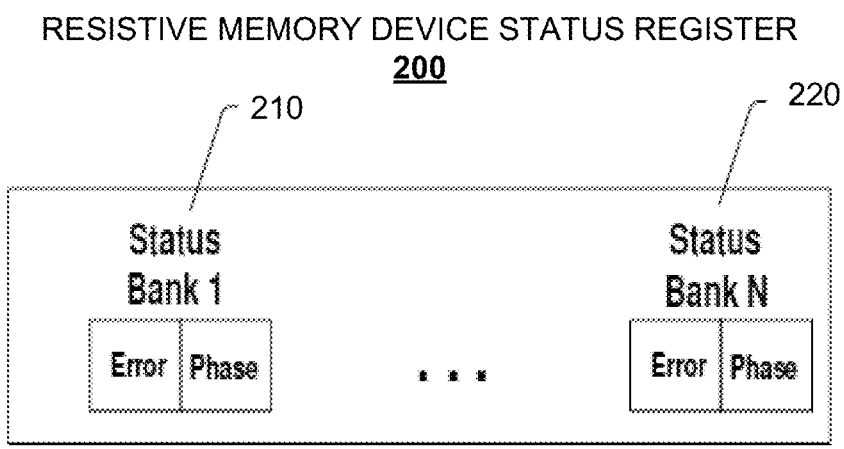
FIG. 2 illustrates a non-limiting example of two terminal resistive memory status bits within a device status register.

Turning now to FIG. 2, illustrated is resistive memory device status register 200. In an aspect, status register 200 comprises numerous status banks. For instance, status bank 1 within the resistive memory device status register 200 is a first status bank 210 having an error status and a phase status. First status bank 210 can be assigned to report error and phase information for a first subset of memory banks (comprising one or more memory banks) of a multi-bank memory device. The resistive memory device status register 200 can also comprise numerous other status banks up to an $N^{th}$ status bank 220, where N is an integer greater than zero. Each of the additional status banks can respectively comprise an error status and a phase status. Thus, the resistive memory device status register 200 can provide multiple status banks. In an embodiment, each status bank 210, 220 aggregates error information for a plurality of banks of memory. In this embodiment, upon identifying an error and phase for the plurality of memory banks from one of status banks 210, 220, a memory controller may implement error correction for memory operations issued to each bank aggregated with the status bank 210, 220 implemented during a timeframe in which the error issued (e.g., see FIG. 3C, infra). In another embodiment, each status bank 201, 220 provides error information for a single bank of memory. In this embodiment, the memory controller may identify the memory bank from the status register itself, and implement the error correction only for the identified memory bank. More generally, however, upon receiving an error identification from a hardware error pin, a memory controller can check resistive memory device status register 200 to identify which memory bank (or group of memory banks) the error, and acquire respective error and phase information pertaining to the error.

Figure 3A:
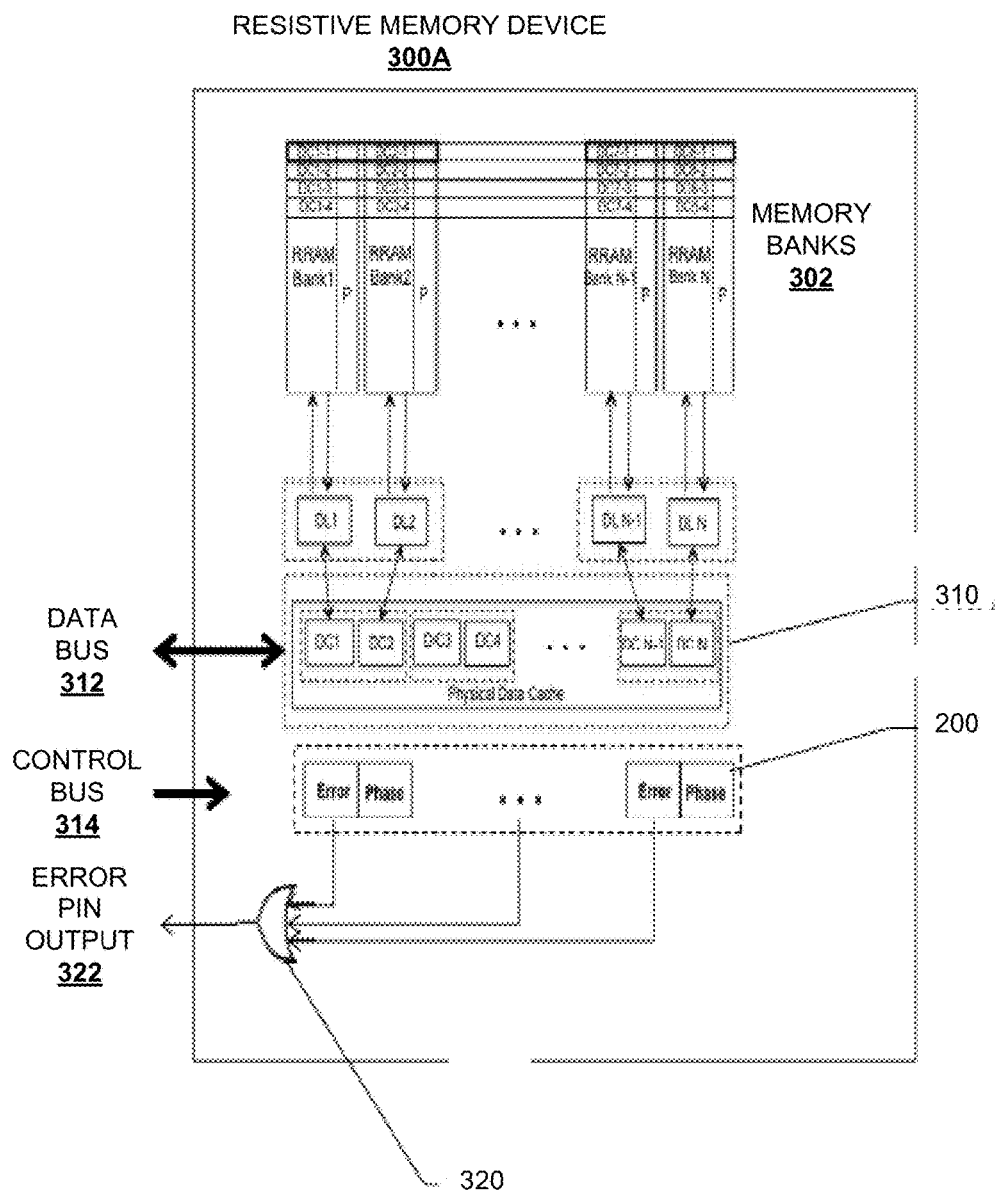
FIG. 3A illustrates a non-limiting example of a two terminal resistive memory device architecture.

Turning now to FIG. 3A, illustrated is an resistive memory architecture comprising a multi-bank non-volatile resistive memory device 300A in an embodiment. In an aspect, illustrated are multiple banks 302 of non-volatile resistive switching memory arrays (e.g., RRAM arrays, two-terminal filamentary resistive switching arrays, phase-change memory arrays, magneto resistive switching memory arrays, conducting bridging memory arrays, and so forth) that can achieve increased operational speeds and data throughput by allowing for the access of data and information in parallel. The multiple resistive memory banks 302 store respective sets of data, and can operate independently of other banks, receive data independently of other banks, and output data independently of other banks. For instance, the multiple memory banks 302 can be operated in parallel to achieve saturation or near saturation of a data bus 312 and efficient utilization of a command bus 314 of the resistive memory device, achieving high operational efficiency. Furthermore, a physical data cache 310 is provided to cache data to be written to one or more of the memory banks 302, or read from one or more of the memory banks 302. Additionally, resistive memory device 300 can comprise a resistive memory device status register 200 for storing error information and phase information as described at FIG. 2, supra.

Because the parallel operation of resistive memory device 300A achieves high throughput and operational efficiency, error handling can cause significant overhead for a host controller or onboard controller (not depicted, but see FIG. 6, infra) of resistive memory device 300A. For instance, the more read and write operations resistive memory device 300A implements per second, the more potential errors can occur in that timeframe. Conventional mechanisms requiring the controller to perform a status read (e.g., issue a read command to a status register 200) for error detection in conjunction with each write or read command can impose significant burden on the controller in the context of a resistive memory device in which a single bank of memory 302 can implement hundreds of thousands of memory operations per second, let alone multiple banks 302 operating in parallel to achieve multiple hundreds of thousands, or even millions of memory operations per second. To correct this problem, resistive memory device 300A provides an error pin 322 to alert the controller that an error has occurred, and instead of implementing a status read for each memory operation, the controller need only implement one or more status reads when the error pin 322 is asserted.

As described at FIG. 2, the resistive memory device status register 200 can store error status information and phase status information in response to an error at one of memory banks 302. This status and phase information is made available for access by the controller. At error pin 322, all of the error bits of resistive memory device status register 200 can be aggregated through aggregation circuitry 320 (e.g., logical 'OR' circuitry) and asserted through error pin 322.

In an aspect, a single hardware error pin 322 can be defined per resistive memory device 300A. For example, a 1'b1 output at error pin 322 can represent an error whereas a 1'b0 can represent no error, though the subject disclosure is in no way limited to this particular standard. Also, each bank error in the resistive memory device 300A can be written to an associated error bit of a status bank 210, 220 of resistive memory device status register 200, which in turn can activate error pin 322. Ideally, error pin 322 will be active or not active after a guaranteed timer corresponding to each memory command issued to resistive memory device 300A expires (e.g., see FIG. 3C), where the timer commences upon commencement of the memory command, and expires upon a predetermined completion time for execution of the command. Furthermore, the resistive controller can be configured to accommodate this timer-based error detection activity. In one example aspect, the error pin 322 and aggregation circuitry 320 can be implemented as an open-drain signal that represents an error potentially associated with numerous banks. The open-drain signal saves space and resources of hardware (e.g., transistors) and control (e.g., activation/deactivation signals) components for implementing the aggregation circuitry 320 and error pin 322.

Also, the disclosed processes for reduced error polling can be compatible with current ONFI RDY/BSY pins or DDR4 alert n pins. For instance, where resistive memory device 300A employs an ONFI bus to interface with a memory controller, or a DDR3 or DDR4 bus to interface with the controller, the multiple error bit signals can be wire-or'ed onto a RDY/BSY pin (e.g., in the case of an ONFI bus) or onto an alert n pin (e.g., in the case of a DDR4) thus allowing for pin reduction to the resistive memory controller. In further embodiments, one hardware error pin can be allocated for each channel to the resistive memory controller in some aspects, or one hardware pin can be allocated for all channels to minimize the number of controller pins allocated to error signaling. In an aspect, in response to error pin activation, the resistive memory controller will access resistive memory device status register 200 and one or more of status banks 210, 220 in order to identify a die and/or bank in error.

Thus, in an example non-limiting embodiment, an resistive memory device 300A can detect a memory bank error and activate an error bit of a status bank 210, 220 associated with the memory bank 302 experiencing the error. The error is identified by the memory controller when error pin 322 is activated. The error pin 322 can be a new pin or a re-purposed ONFI RDY/BSY pin. The controller can use the error pin 322 as an interrupt, in one embodiment, or poll-based signal (e.g., the memory bank can poll the error pin 322 following expiration of a command timer) to detect an error in another embodiment. Upon detection of an error, the controller can service the error by reading the resistive memory device status register 200. The reading of the status register can identify the die, bank 302, and phase in error from the resistive memory device 300A. Furthermore, the bank 302 in error can be used to identify the command in error.

As a remedy, the controller can re-try the command (e.g., write command) and the phase status information can be utilized as criteria to implement a re-try of the command. If a re-try is unsuccessful, then the controller can initiate a move to a physical group and an update of its map table can be implemented. Furthermore, the controller can then try to reclaim the physical group, if such reclamation is unsuccessful then the controller will mark the physical group as defective in a defect map table. Also, to facilitate implementation, the controller may reserve some physical groups as spare physical groups.

Figure 3B:
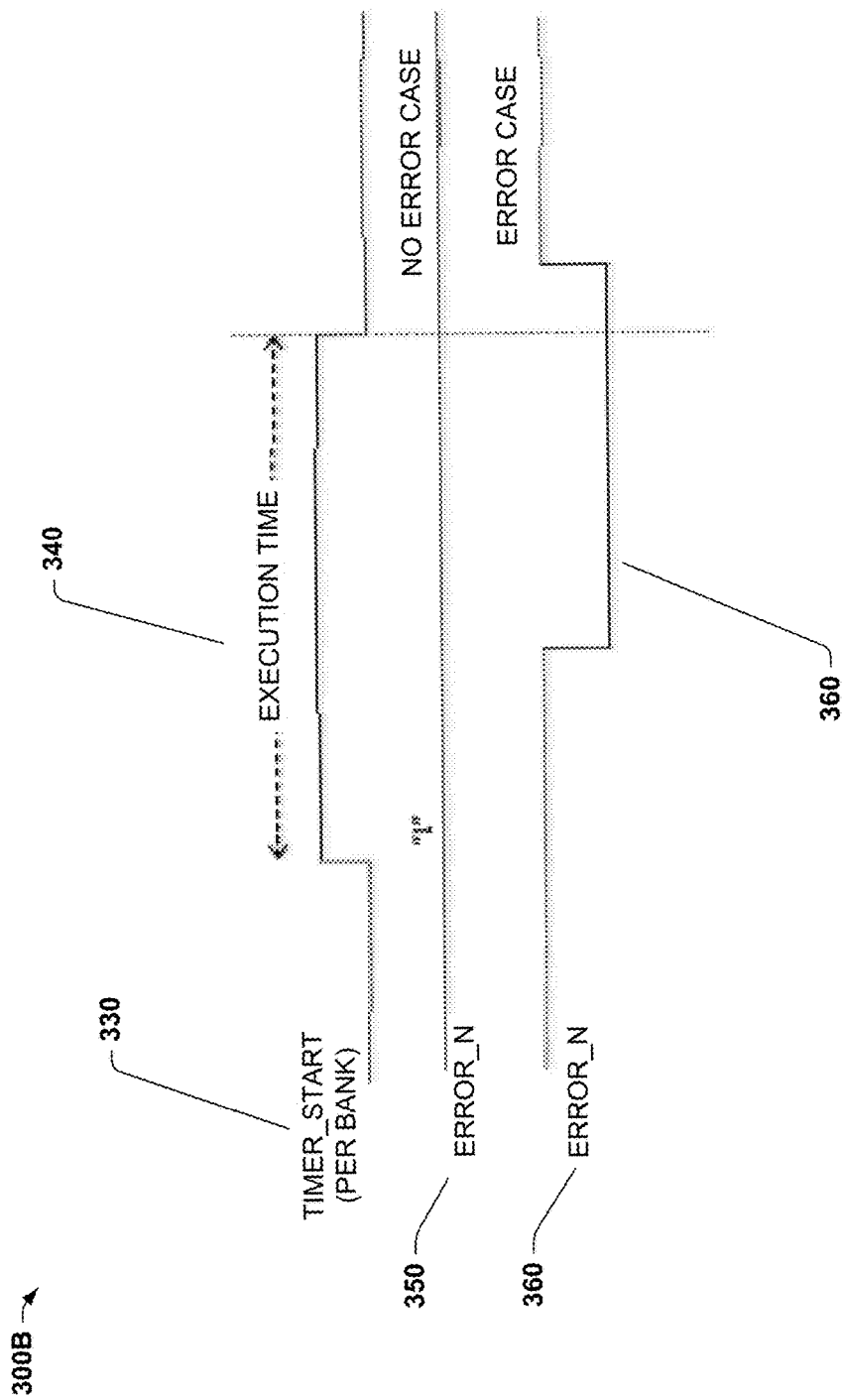
FIG. 3B illustrates a non-limiting example of error pin signaling in response to a write command for a single bank of resistive switching memory.

Turning now to FIG. 3B, illustrated is a non-limiting example 300B of an error pin behavior in a single bank device. For instance, a memory device controller can send a command to the memory device, which starts a timer 330 which is programmed to expire upon completion of the command. In an embodiment, when the timer 330 expires, the memory device controller can sample the error pin. By convention, the error pin signal of FIG. 3B is high for no error, and goes low in response to an error, though other conventions may be employed within the scope of the present disclosure. In an aspect, upon the absence of an error there can be an indication that a successful completion of the command occurred. Furthermore, if the presence of an error is indicated, then the command is determined to have failed and the memory controller device can take proper action to recover from the error (e.g., execute the command again, read error information from the status registrar, etc.). In another embodiment, the memory device controller can receive an interrupt signal in response to change in the error pin signal (e.g., the error pin going low, for the high/low signaling no error/error convention of FIG. 3B).

In an aspect, upon the start of timer 330, the execution of the command operation can occur during an execution time 340. If an error occurs during the execution time 340, then such error can be detected by the error pin as an interrupt signal or a signal change. For instance, error n 350 did not present a signal change during execution time 340 so no error was indicated by the error pin. However, error n 360 shows a signal change 360 during execution time 340, such that a controller can determine that an error has occurred from the error pin (e.g., receiving the signal change information).

Figure 3C:
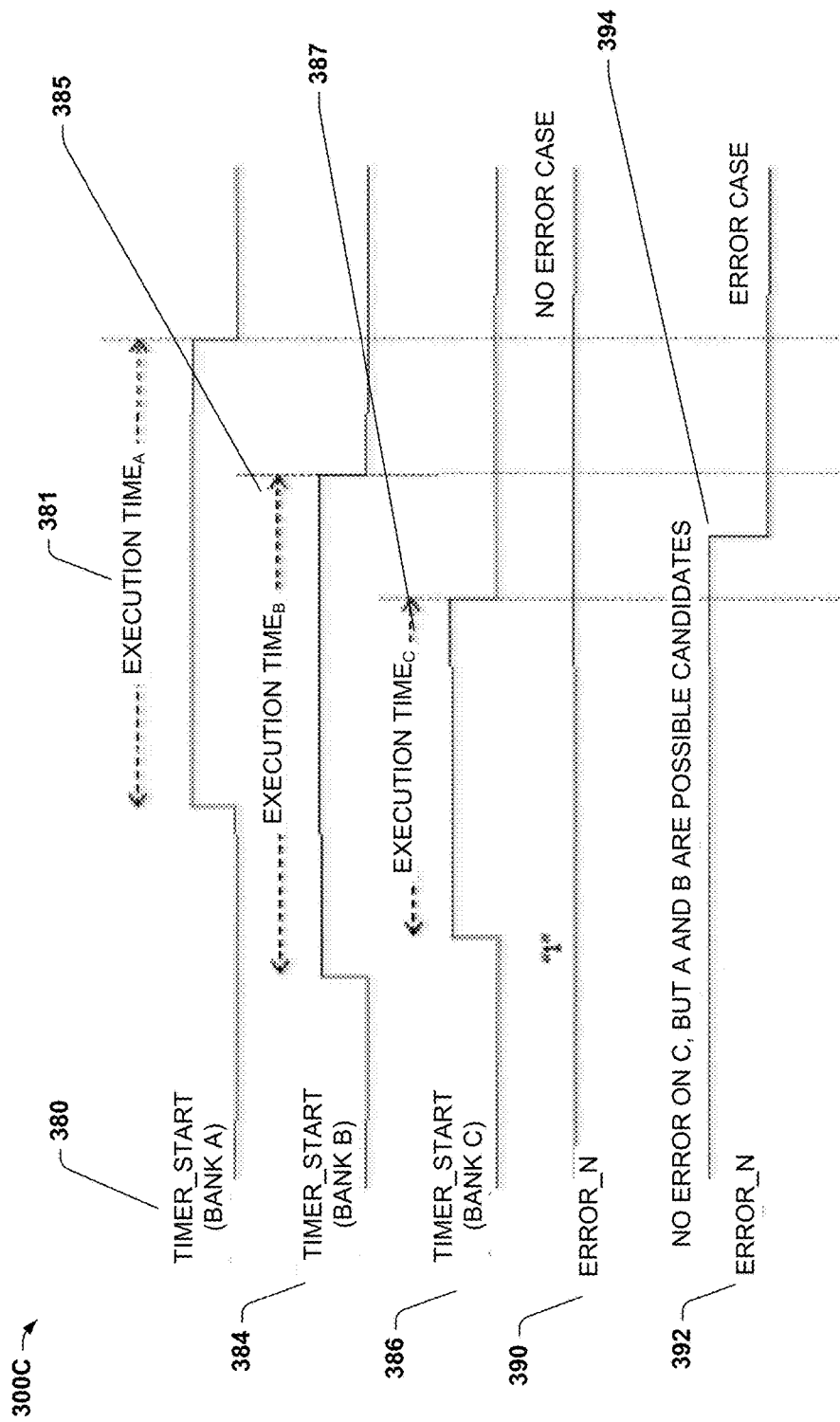
FIG. 3C illustrates a non-limiting example of error pin signaling in response to a write command for a multi-bank resistive switching memory.

Turning now to FIG. 3C, illustrated is a non-limiting example 300C of an error pin behavior in a multi-bank device. In an aspect, each bank can have an error status signal indicating a status of the bank. To save pins on a device, an error pin can be represented as an aggregate of a status of multiple banks in the device, or all the banks in the device. When an error pin is asserted indicating an error, the error can correspond to one or more of the banks in the device that are in process of executing a command (e.g., banks not executing a command can be ignored in response to assertion of the error pin). Upon an expiration of any of the timers indicating a completion of one of the commands, the memory controller device can sample the error pin. When asserted, a detected error can be determined to correspond to any of the memory banks currently processing a command issued by the memory controller device. For instance, an error may correspond to any bank in the process of executing a command during a period in which an error was presented by the error pin. In an embodiment, the error signal and error pin can be asserted by a bank experiencing an error only upon expiration of a timer associated with a memory operation of that bank. In the latter case, assertion of the error pin can be mapped only to those banks having memory operations expected to complete at the time the error pin is asserted.

In another aspect, upon assertion of the error pin, the memory controller device can read the status register(s) of all banks or selectively access status registers associated with banks that were in the process of completing commands when the error pin was asserted. In yet another aspect, the memory device controller can then identify the bank in error and take proper action (e.g., read error information from the appropriate status register). In another embodiment, a reading of the status registers may reset the error pin. In non-limiting example 300C, the timer 380 in bank A of a multi-bank device can last for a duration of time represented by execution time 381. Furthermore, timer 384 associated with bank B of the multi-bank device can last for a duration of time represented by execution time 385. In another aspect, timer 386 associated with bank C of the multi-bank device can last for a duration of time represented by execution time 387. Accordingly, error n 390 does not present a signal change during any of the execution times and therefore does not present with an error to any error pin. However, error n 392 does present a signal change 394 that can be received by the error pins associated with bank A and bank B, but not bank C because the signal change 394 occurred during execution time 382 and execution time 384 but not execution time 386.

Figure 4:
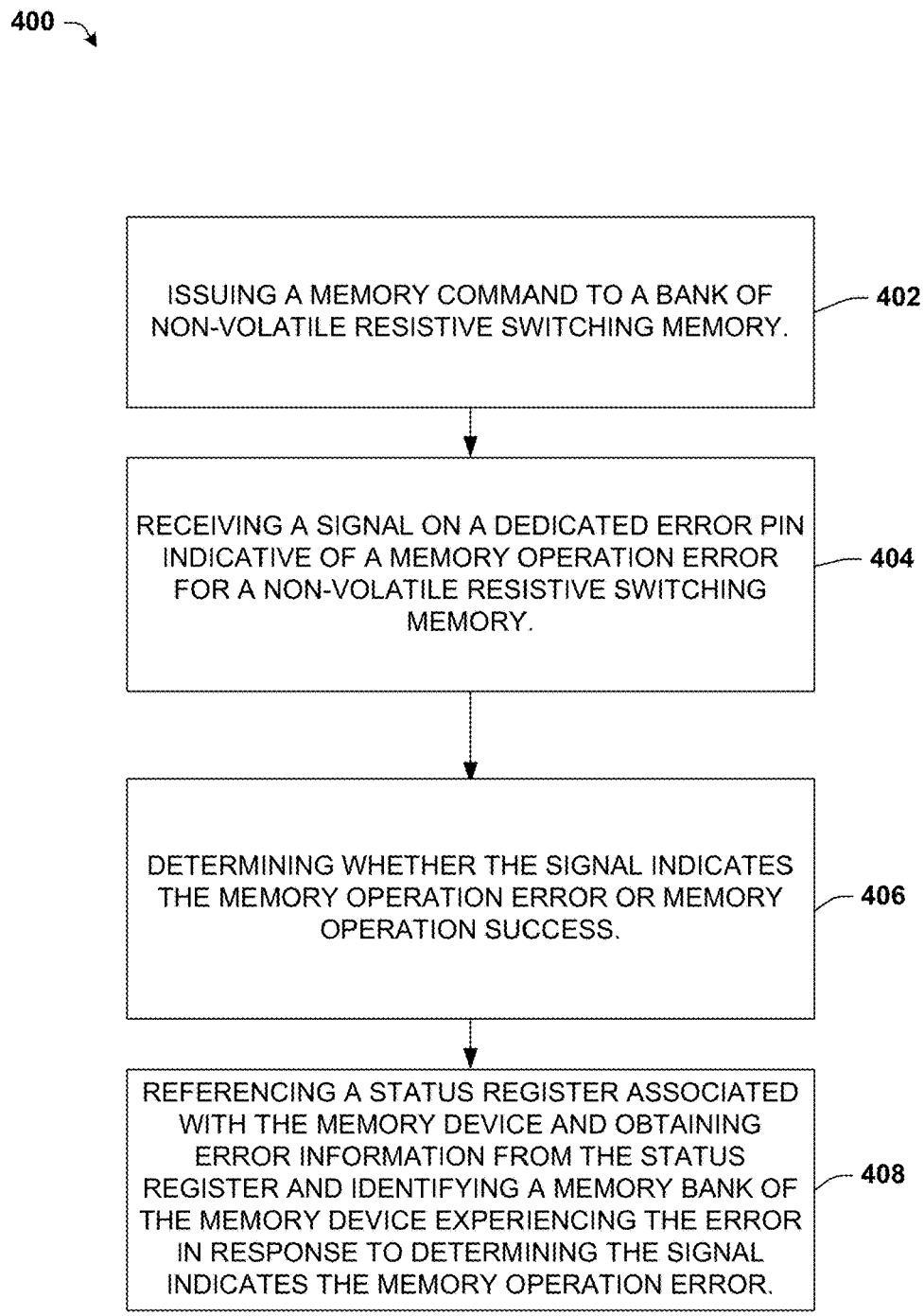
FIG. 4 illustrates a non-limiting embodiment of a method for detecting the occurrence of an error corresponding to an operational task.
Figure 5:
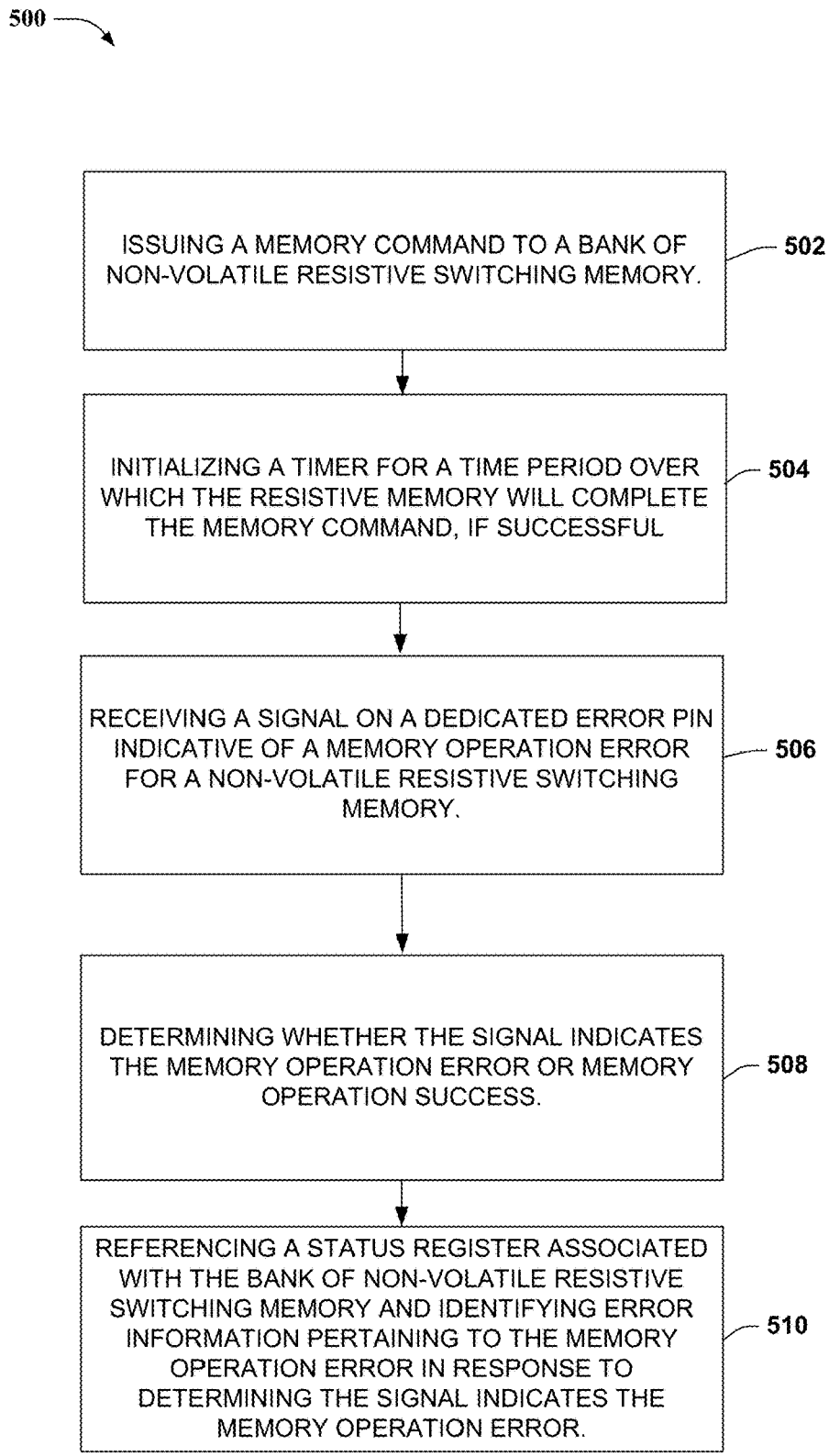
FIG. 5 illustrates a non-limiting embodiment of a method for detecting the occurrence of an error corresponding to an operational task.

FIGS. 4-5 illustrate various methodologies in accordance with certain embodiments of this disclosure. While, for purposes of simplicity of explanation, the methodologies are shown as a series of acts within the context of various flowcharts, it is to be understood and appreciated that embodiments of the disclosure are not limited by the order of acts, as some acts may occur in different orders and/or concurrently with other acts from that shown and described herein. For example, those skilled in the art will understand and appreciate that a methodology can alternatively be represented as a series of interrelated states or events, such as in a state diagram. Moreover, not all illustrated acts may be required to implement a methodology in accordance with the disclosed subject matter. Additionally, it is to be further appreciated that the methodologies disclosed hereinafter and throughout this disclosure are capable of being stored on an article of manufacture to facilitate transporting and transferring such methodologies to computers. The term article of manufacture, as used herein, is intended to encompass a computer program accessible from any computer-readable device or storage media.

FIG. 4 provides an example method 400 for detecting the occurrence of a memory error in conjunction with issuing a memory command to a memory device. At 402, a memory command is issued to a bank of non-volatile resistive switching memory. In an embodiment, the bank of non-volatile resistive switching memory can have a write time within a range selected from about 1 microsecond to about 10 microseconds. At 404, a signal is received on a dedicated error pin indicative of a memory operation error for the memory device. At 406, the signal is determined to indicate a memory operation error or a memory operation success. At 408, a status register associated with the memory device is referenced and error information is obtained from the status register identifying a memory bank of the memory device experiencing the error, in response to determining the signal indicates the memory operation error. In an embodiment, the information obtained from the status register identifies the memory bank of the memory device experiencing the error, and identifies a set bit phase or a reset bit phase for which the error occurred. In another embodiment, the information obtained from the status register identifies a plurality of memory banks which could be associated with the error. In such embodiments, method 400 can further comprise identifying which of the plurality of memory banks was executing a memory operation when the signal is received on the dedicated error pin, or which of the plurality of memory banks was expected to complete a memory operation at the time the signal is received on the dedicated error pin. Method 400 can further comprise identifying one of the plurality of memory banks experiencing the error. Further, method 400 can comprise correcting the memory operation error in response to identifying the memory bank experiencing the error.

FIG. 5 provides an example method 500 for detecting a memory error for a multi-bank non-volatile resistive switching memory device. At 502, a memory command is issued to a bank of non-volatile resistive switching memory. At 504, a timer is initialized for a time period over which the bank of non-volatile resistive switching memory is estimated to complete the memory command, if successful. At 506, a signal is received on a dedicated error pin indicative of a memory operation error for the multi-bank non-volatile resistive switching memory device. At 508, the signal is determined to indicate a memory operation error or a memory operation success. At 510, a status register associated with the bank of non-volatile resistive switching memory is referenced and error information is identified pertaining to the memory operation error in response to determining the signal indicates the memory operation error. Method 500 can further comprise identifying a memory bank of the multi-bank non-volatile resistive switching memory device experiencing the memory operation error at least in part from the error information, in an embodiment. In a further embodiment, method 500 can further comprise issuing a correction command to the identified memory bank to correct the memory operation error. In yet another embodiment, method 500 can comprise second referencing of the status register and determining whether a second memory operation error has occurred. Further, method 500 can comprise resetting the dedicated error pin in response to determining that the second memory operation has not occurred.

Example Embodiments

Figure 6:
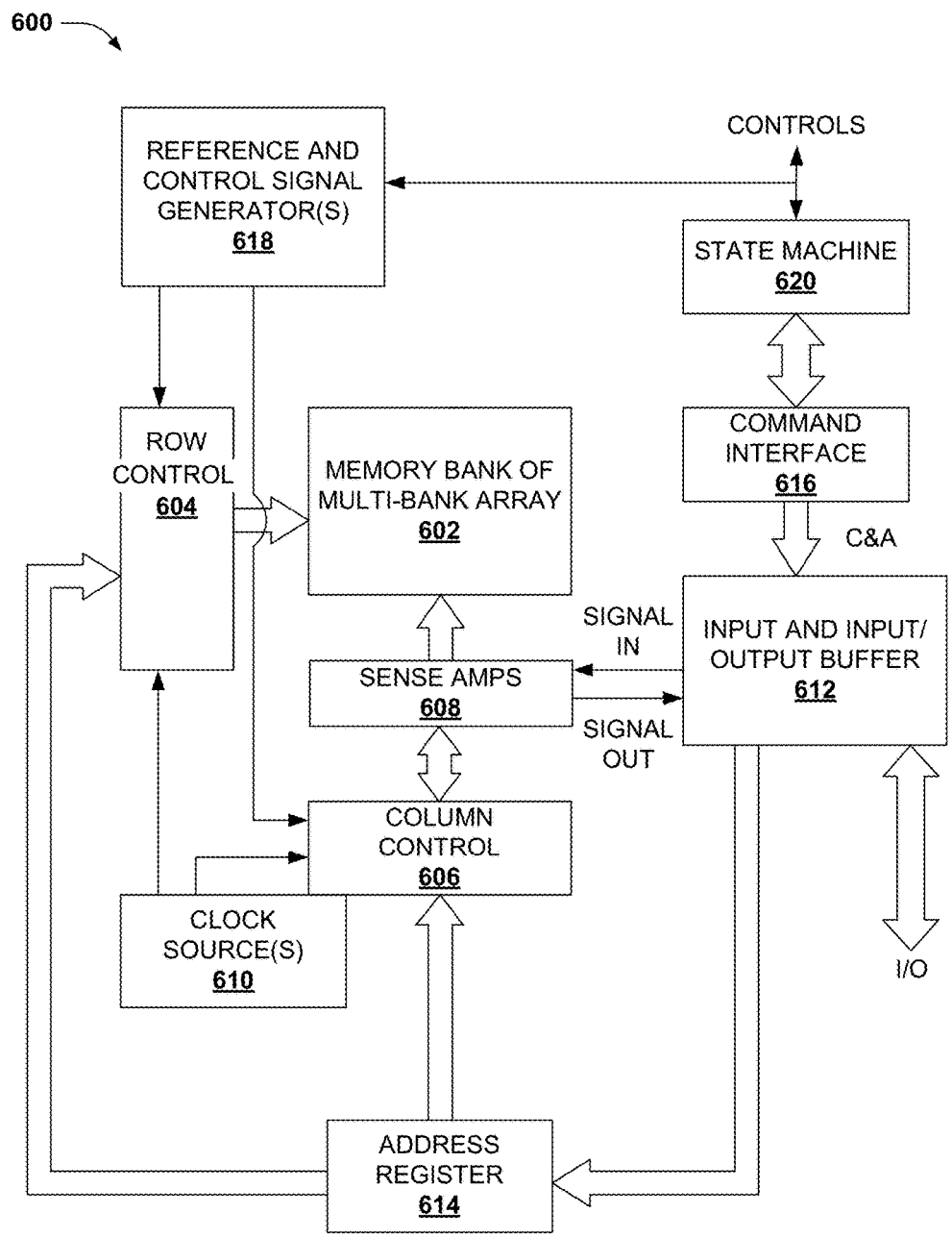
FIG. 6 illustrates a block diagram of an example electronic operating environment in accordance with certain embodiments of this disclosure.

In order to provide a context for the various aspects of the disclosed subject matter, FIG. 6, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 702 of FIG. 7, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 6 illustrates a block diagram of an example operating and control environment 600 for a memory bank 602, optionally of a multi-bank memory cell array, according to aspects of the subject disclosure. In at least one aspect of the subject disclosure, memory bank 602 can comprise memory selected from a variety of memory cell technologies. In at least one embodiment, memory bank 602 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In an embodiment, memory bank 602 can be configured to operate according to a first set of configurations (e.g., MLC, SLC, operation voltage, clock speed, latency, etc.) that is at least in part different from a second set of configurations of a second memory bank of a multi-bank array of memory.

A column controller 606 and sense amps 608 can be formed adjacent to memory bank 602. Moreover, column controller 606 can be configured to activate (or identify for activation) a subset of bitlines of memory bank 602. Column controller 606 can utilize a control signal provided by a reference and control signal generator(s) 618 to activate, as well as operate upon, respective ones of the subset of bitlines, applying suitable program, erase or read voltages to those bitlines. Non-activated bitlines can be kept at an inhibit voltage (also applied by reference and control signal generator(s) 618), to mitigate or avoid bit-disturb effects on these non-activated bitlines.

In addition, operating and control environment 600 can comprise a row controller 604. Row controller 604 can be formed adjacent to and electrically connected with word lines of memory bank 602. Further, utilizing control signals of reference and control signal generator(s) 618, row controller 604 can select particular rows of memory cells with a suitable selection voltage. Moreover, row controller 604 can facilitate program, erase or read operations by applying suitable voltages at selected word lines.

Sense amps 608 can read data from, or write data to the activated memory cells of memory bank 602, which are selected by column control 606 and row control 604. Data read out from memory bank 602 can be provided to an input and input/output buffer 612 (e.g., an LPDDR buffer, in some embodiments). Likewise, data to be written to memory bank 602 can be received from the input and input/output buffer 612 and written to the activated memory cells of memory bank 602.

A clock source(s) 610 can provide respective clock pulses to facilitate timing for read, write, and program operations of row controller 604 and column controller 606. Clock source(s) 610 can further facilitate selection of wordlines or bitlines in response to external or internal commands received by operating and control environment 600. Input and input/output buffer 612 can comprise a command and address input, as well as a bidirectional data input and output. Instructions are provided over the command and address input, and the data to be written to memory bank 602 as well as data read from memory bank 602 is conveyed on the bidirectional data input and output, facilitating connection to an external host apparatus, such as a computer or other processing device (not depicted, but see e.g., computer 702 of FIG. 7, infra).

Input and input/output buffer 612 can be configured to receive write data, receive an erase instruction, receive a status or maintenance instruction, output readout data, output status information, and receive address data and command data, as well as address data for respective instructions. Address data can be transferred to row controller 604 and column controller 606 by an address register 610. In addition, input data is transmitted to memory bank 602 via signal input lines between sense amps 608 and input and input/output buffer 612, and output data is received from memory bank 602 via signal output lines from sense amps 608 to input and input/output buffer 612. Input data can be received from the host apparatus, and output data can be delivered to the host apparatus via the I/O bus.

Commands received from the host apparatus can be provided to a command interface 616. Command interface 616 can be configured to receive external control signals from the host apparatus, and determine whether data input to the input and input/output buffer 612 is write data, a command, or an address. Input commands can be transferred to a state machine 620.

State machine 620 can be configured to manage programming and reprogramming of memory bank 602 (as well as other memory banks of the multi-bank memory array). Instructions provided to state machine 620 are implemented according to control logic configurations, enabling state machine 620 to manage read, write, erase, data input, data output, and other functionality associated with memory bank 602. In some aspects, state machine 620 can send and receive acknowledgments and negative acknowledgments regarding successful receipt or execution of various commands. In further embodiments, state machine 620 can decode and implement status-related commands, decode and implement configuration commands, and so on.

To implement read, write, erase, input, output, etc., functionality, state machine 620 can control clock source(s) 608 or reference and control signal generator(s) 618. Control of clock source(s) 608 can cause output pulses configured to facilitate row controller 604 and column controller 606 implementing the particular functionality. Output pulses can be transferred to selected bitlines by column controller 606, for instance, or wordlines by row controller 604, for instance.

In connection with FIG. 7, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 7:
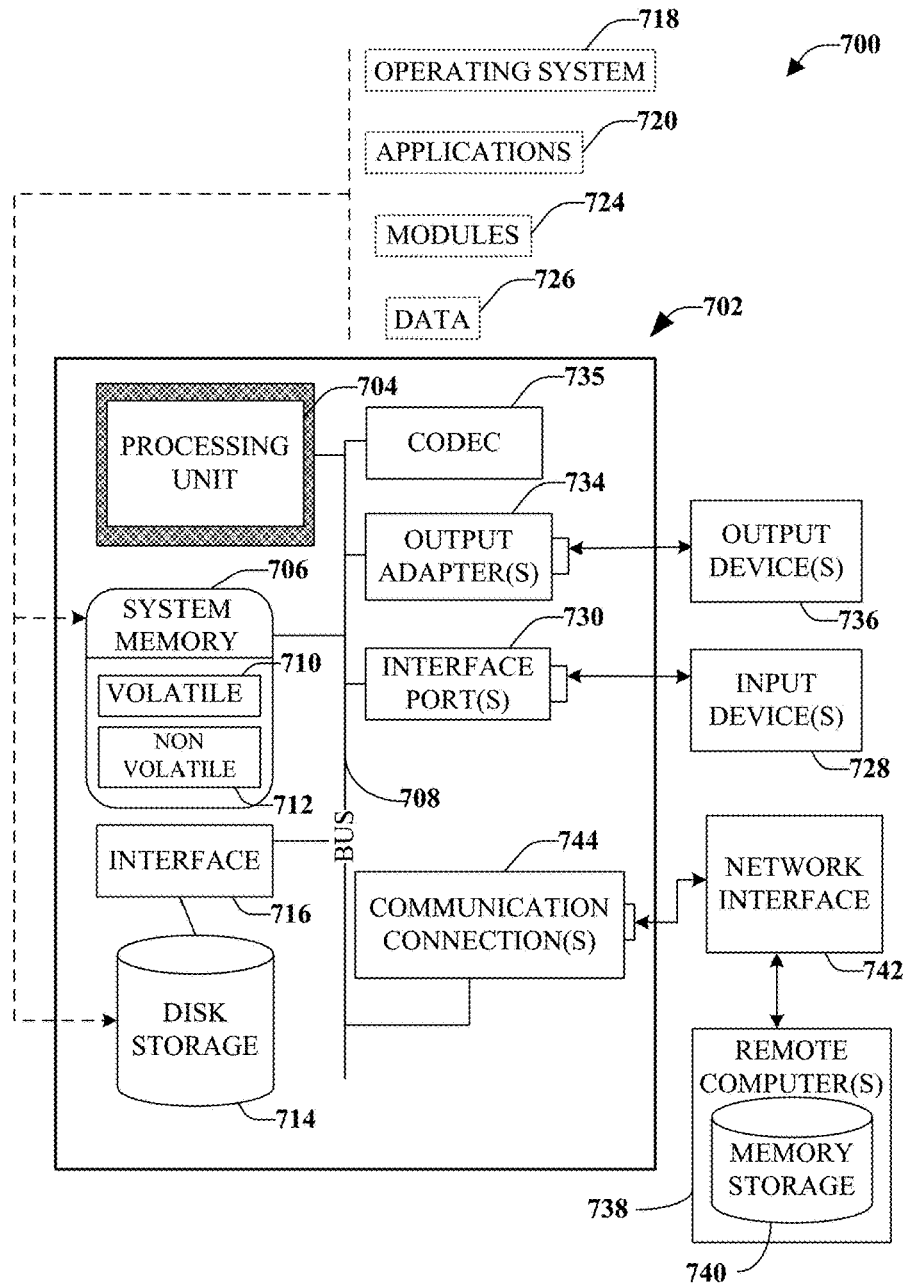
FIG. 7 illustrates a block diagram of an example computing environment in accordance with certain embodiments of this disclosure.

With reference to FIG. 7, a suitable environment 700 for implementing various aspects of the claimed subject matter includes a computer 702. The computer 702 includes a processing unit 704, a system memory 706, a codec 735, and a system bus 708. The system bus 708 couple's system components including, but not limited to, the system memory 706 to the processing unit 704. The processing unit 704 can be any of various available processors. Dual microprocessors and other multiprocessor architectures also can be employed as the processing unit 704.

The system bus 708 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 794), and Small Computer Systems Interface (SCSI).

The system memory 706 includes volatile memory 710 and non-volatile memory 712, which can employ one or more of the disclosed memory architectures, in various embodiments. The basic input/output system (BIOS), containing the basic routines to transfer information between elements within the computer 702, such as during start-up, is stored in non-volatile memory 712. In addition, according to present innovations, codec 735 may include at least one of an encoder or decoder, wherein the at least one of an encoder or decoder may consist of hardware, software, or a combination of hardware and software. Although, codec 735 is depicted as a separate component, codec 735 may be contained within non-volatile memory 712. By way of illustration, and not limitation, non-volatile memory 712 can include read only memory (ROM), programmable ROM (PROM), electrically programmable ROM (EPROM), electrically erasable programmable ROM (EEPROM), or Flash memory. Non-volatile memory 712 can employ one or more of the disclosed memory devices, in at least some embodiments. Moreover, non-volatile memory 712 can be computer memory (e.g., physically integrated with computer 702 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 710 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 702 may also include removable/non-removable, volatile/non-volatile computer storage medium. FIG. 7 illustrates, for example, disk storage 714. Disk storage 714 includes, but is not limited to, devices like a magnetic disk drive, solid state disk (SSD) floppy disk drive, tape drive, Jaz drive, Zip drive, LS-100 drive, flash memory card, or memory stick. In addition, disk storage 714 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 714 to the system bus 708, a removable or non-removable interface is typically used, such as interface 716. It is appreciated that storage devices 714 can store information related to a user. Such information might be stored at or provided to a server or to an application running on a user device. In one embodiment, the user can be notified e.g., by way of output device(s) 736) of the types of information that are stored to disk storage 714 or transmitted to the server or application. The user can be provided the opportunity to opt-in or opt-out of having such information collected or shared with the server or application (e.g., by way of input from input device(s) 728).

It is to be appreciated that FIG. 7 describes software that acts as an intermediary between users and the basic computer resources described in the suitable operating environment 700. Such software includes an operating system 718. Operating system 718, which can be stored on disk storage 714, acts to control and allocate resources of the computer system 702. Applications 720 take advantage of the management of resources by operating system 718 through program modules 724, and program data 726, such as the boot/shutdown transaction table and the like, stored either in system memory 706 or on disk storage 714. It is to be appreciated that the claimed subject matter can be implemented with various operating systems or combinations of operating systems.

A user enters commands or information into the computer 702 through input device(s) 728. Input devices 728 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 704 through the system bus 708 via interface port(s) 730. Interface port(s) 730 include, for example, a serial port, a parallel port, a game port, and a universal serial bus (USB). Output device(s) 736 use some of the same type of ports as input device(s) 728. Thus, for example, a USB port may be used to provide input to computer 702 and to output information from computer 702 to an output device 736. Output adapter 734 is provided to illustrate that there are some output devices 736 like monitors, speakers, and printers, among other output devices 736, which require special adapters. The output adapters 734 include, by way of illustration and not limitation, video and sound cards that provide a means of connection between the output device 736 and the system bus 708. It should be noted that other devices or systems of devices provide both input and output capabilities such as remote computer(s) 738.

Computer 702 can operate in a networked environment using logical connections to one or more remote computers, such as remote computer(s) 738. The remote computer(s) 738 can be a personal computer, a server, a router, a network PC, a workstation, a microprocessor based appliance, a peer device, a smart phone, a tablet, or other network node, and typically includes many of the elements described relative to computer 702. For purposes of brevity, only a memory storage device 740 is illustrated with remote computer(s) 738. Remote computer(s) 738 is logically connected to computer 702 through a network interface 742 and then connected via communication connection(s) 744. Network interface 742 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 744 refers to the hardware/software employed to connect the network interface 742 to the bus 708. While communication connection 744 is shown for illustrative clarity inside computer 702, it can also be external to computer 702. The hardware/software necessary for connection to the network interface 742 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for reducing error polling for a memory controller device, comprising:
   issuing a memory command to a bank of non-volatile resistive switching memory of a non-volatile resistive switching memory device;
   receiving a signal on a dedicated error pin for the non-volatile resistive switching memory device;
   determining whether the signal indicates occurrence of an error for the memory command; and
   referencing a status register associated with the bank of non-volatile resistive switching memory and identifying error information pertaining to the error in response to determining the signal indicates the occurrence of the error.

2. The method of claim 1, wherein the memory command is a write operation or a read operation.

3. The method of claim 1, further comprising initializing a timer in response to issuing the memory command for a time period equal to or approximately equal to a write time of the non-volatile resistive switching memory device.

4. The method of claim 3, wherein the receiving the signal further comprises polling the dedicated error pin upon completion of the timer and measuring a signal level of the dedicated error pin in response to the polling.

5. The method of claim 1, wherein the receiving the signal further comprises monitoring a signal level of the dedicated error pin and implementing an interrupt in response to measuring a change in the signal.

6. The method of claim 5, wherein measuring the change in the signal further comprises measuring an edge-triggered change in the signal.

7. The method of claim 1, wherein the dedicated error pin is allocated to the bank of non-volatile resistive switching memory.

8. The method of claim 1, wherein the dedicated error pin is allocated to the bank of non-volatile resistive switching memory and to a second bank of non-volatile resistive switching memory of the non-volatile resistive switching memory device.

9. The method of claim 8, wherein referencing the status register further comprises accessing a first status bank of the status register dedicated to the bank of non-volatile resistive switching memory and accessing a second status bank of the status register dedicated to the second bank of non-volatile resistive switching memory in conjunction with identifying the error information.

10. The method of claim 9, further comprising one of:
    identifying the bank of non-volatile resistive switching memory as the source of the error in response to recovering the error information from the first status bank of the status register; or
    identifying the second bank of non-volatile resistive switching memory as the source of the error in response to recovering the error information from the second status bank of the status register.

11. The method of claim 1, wherein the error information comprises at least one of:
    die information identifying a die of the non-volatile resistive switching memory device associated with the error;
    bank information identifying the bank of non-volatile resistive switching memory as being associated with the error;
    write phase information identifying a set phase or a reset phase associated with the error;
    byte status information pertaining to the error;
    event status information pertaining to the error;
    operation status condition pertaining to the error;
    status condition information pertaining to the error; or
    status event information pertaining to the error.

12. A resistive switching memory device, comprising:
    a plurality of memory banks of non-volatile resistive switching memory comprising a first memory bank and a second memory bank;
    a status register configured to generate memory error information pertaining to the resistive switching memory device, the status register comprising a first status bank configured to store first error information pertaining to the first memory bank and a second status bank configured to store second error information pertaining to the second memory bank, the first status bank comprising a first error signal output and the second status bank comprising a second error signal output;
    a control bus comprising hardware control pins including a hardware error pin, the hardware error pin is connected to the first error signal output and to the second error signal output, wherein:
        the hardware error pin identifies an error at the resistive switching memory device in response to the first error signal output indicating an error for the first memory bank or the second error signal output indicating an error for the second memory bank, and
        the first status bank stores the first error information in conjunction with the first error signal output indicating the error for the first memory bank, and the second status bank stores the second error information in conjunction with the second error signal output indicating the error for the second memory bank.

13. The resistive switching memory device of claim 12, wherein the first status bank is further configured to store first operational phase information pertaining to the first memory bank, and the second status bank is further configured to store second operational phase information pertaining to the second memory bank.

14. The resistive switching memory device of claim 12, wherein at least one of:
    the control bus is an open NAND Flash interface working group control bus and the hardware error pin is a RDY/BSY pin repurposed to output the first error signal output and the second error signal output over the control bus; or
    the control bus is a double data rate 4 control bus and the hardware error pin is an alert_n pin repurposed to output the first error signal output and the second error signal output over the control bus.

15. A method for reducing an amount of polling conducted by a resistive memory controller device comprising:
    issuing a plurality of memory commands to a plurality of memory banks of a non-volatile resistive switching memory device, including issuing a first memory command to a first memory bank and issuing a second memory command to a second memory bank;
    receiving a signal on a dedicated error pin indicative of one or more memory operation errors for the plurality of memory banks;
    determining the signal to indicate an error;
    referencing an aggregated status register associated with the first memory bank and with the second memory bank for error information; and
    identifying whether the error pertains to the first memory command or to the second memory command at least in part from the error information.

16. The method of claim 15, further comprising commencing a first timer having a first duration for the first memory command, and commencing a second timer having a second duration for the second memory command.

17. The method of claim 16, further comprising:
    determining whether the first timer or the second timer is still pending upon determining the signal to indicate the error; and
    identifying whether the error pertains to the first memory command or to the second memory command further in part from whether the first timer or the second timer is still pending upon determining the signal to indicate the error.

18. The method of claim 16, further comprising:
    determining whether the first timer or the second timer expires concurrent with determining the signal to indicate the error; and
    identifying whether the error pertains to the first memory command or to the second memory command further in part from whether the first timer or the second timer expires concurrent with determining the signal to indicate the error.

19. The method of claim 15, wherein the aggregated status register comprises a first status bank that stores first error data and first phase data for the first memory bank, and comprises a second status bank that stores second error data and second phase data for the second memory bank.

20. The method of claim 19, wherein the first phase data and the second phase data indicate a set phase error or a reset phase error for the first memory bank and the second memory bank, respectively.

* * * * *